US006815940B2

(12) United States Patent
Nakashimo (10) Patent No.: US 6,815,940 B2
(45) Date of Patent: Nov. 9, 2004

(54) DIODE CIRCUIT

(75) Inventor: Takao Nakashimo, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/298,711

(22) Filed: Nov. 18, 2002

(65) Prior Publication Data

US 2003/0107048 A1 Jun. 12, 2003

(30) Foreign Application Priority Data

Nov. 19, 2001 (JP) ........................................ 2001-352943
Nov. 1, 2002 (JP) ........................................ 2002-320247

(51) Int. Cl.$^7$ ............................................... G05F 1/40
(52) U.S. Cl. ...................................... 323/288; 327/387
(58) Field of Search .............................. 327/387, 368, 327/365, 419, 493; 257/158, 271, 288; 323/284, 288, 282, 349; 315/289, 290, 291, 307, 224, 225, 209 R (56) References Cited

U.S. PATENT DOCUMENTS

| | | | |
|---|---|---|---|
| 4,709,190 A | * | 11/1987 | Allington .................... 315/307 |
| 5,914,569 A | * | 6/1999 | Bildgen .................... 215/209 R |
| 6,344,641 B1 | * | 2/2002 | Blalock et al. ............. 250/205 |
| 6,448,752 B1 | * | 9/2002 | Umemoto .................... 323/288 |

* cited by examiner

Primary Examiner—Wilson Lee
(74) Attorney, Agent, or Firm—Adams & Wilks

(57) ABSTRACT

A reduced power consumption diode circuit has a first voltage comparator that compares a voltage at a cathode terminal with a first sum of a voltage at an anode terminal and a voltage across a second voltage source, and outputs a reset signal. A second voltage comparator compares the voltage at the anode terminal with a second sum of the voltage at the cathode terminal and a voltage across the first voltage source, and outputs a set signal. A first latch circuit outputs a low level signal when the reset signal is input and a high level signal when the set signal is input. A diode has an anode connected to the anode terminal and a cathode connected to the cathode terminal, and an n-channel MOS transistor turns off in response to the low level signal and turns on in response to the high level signal.

19 Claims, 6 Drawing Sheets

DIODE CIRCUIT

BACKGROUND OF THE INVENTION

1. Field of the Invention

The present invention relates to semiconductor integrated circuit, and more particularly to a diode circuit.

2. Description of the Related Art

A diode has been used as a commutator that commutates a current direction in one way.

Figure 2:
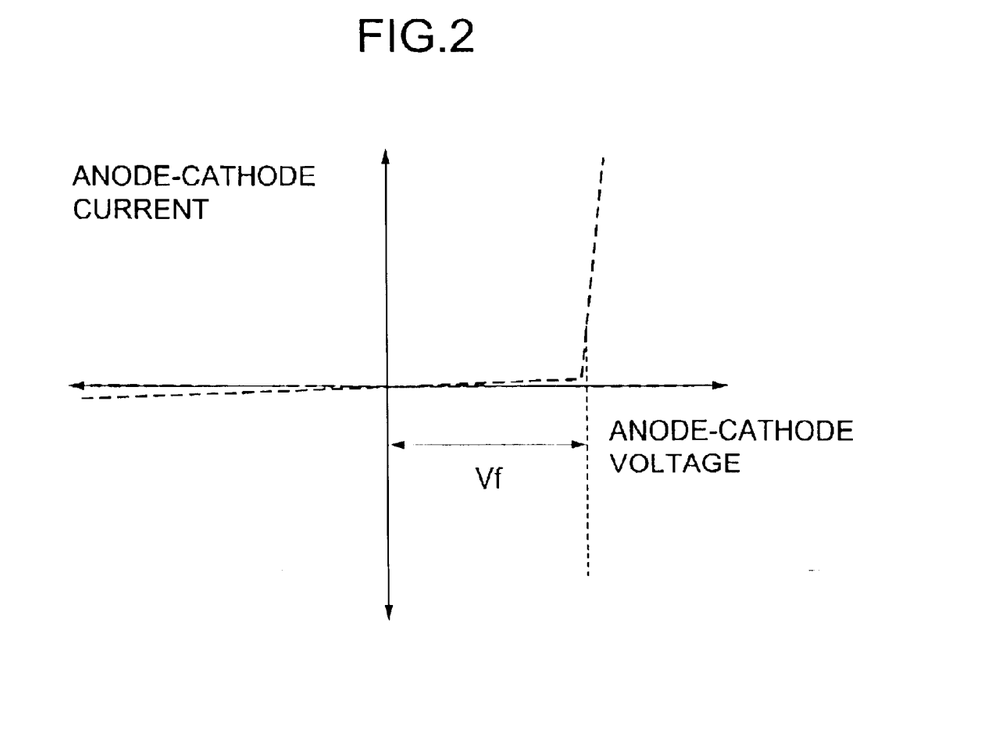
FIG. 2 is a diagram showing a relationship between a voltage and a current of the diode.

FIG. 2 is a diagram showing a voltage between an anode and a cathode of a diode single unit and a current that flows therebetween. The operation of the diode single unit will be described with reference to FIG. 2.

In the case where a voltage between the anode and the cathode is negative, that is, the anode voltage is lower than the cathode voltage, no current flows in the diode ideally.

Also, in the case where the voltage between the anode and the cathode is positive, that is, the anode voltage is higher than the cathode voltage, and the voltage between the anode and the cathode is Vf or higher, a current flows in the diode from the anode toward the cathode.

Ideally, the diode must allow the current to flow therein when the voltage between the anode and the cathode is positive. However, because no current flows unless a voltage of Vf or more is applied, there arises such a problem that an energy of Vf×current is excessively consumed.

SUMMARY OF THE INVENTION

In order to solve the above-mentioned problem, a diode circuit according to the present invention is structured by turning on or off a switch element which is connected in parallel with a diode by the positive/negative of a voltage between an anode and a cathode of the diode.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Now, a description will be given in more detail of preferred embodiments of the present invention with reference to the accompanying drawings.

According to the present invention, a semiconductor integrated circuit includes a first voltage comparator that compares voltages at the respective terminals with each other and inverts an output due to a voltage difference therebetween, a second voltage comparator that compares voltages at two terminals with each other and inverts an output due to a voltage difference therebetween, and a control circuit to which an output of the first voltage comparator and an output of the second voltage comparator are inputted. In addition, the diode circuit includes a switch circuit whose on/off state is controlled in accordance with an output of the control circuit. Then, the switch circuit is connected between the two terminals, and the on/off state of the switch circuit changes over in accordance with the voltage difference between the two terminals.

Also, the present invention is directed to a semiconductor integrated circuit that compares voltages at an anode terminal and a cathode terminal and controls an output current. That is, the present invention includes a first voltage comparator that compares the voltage at the cathode terminal with a sum of the voltage at the anode terminal and the voltage across the second voltage source, and outputs a reset signal in the case where the voltage at the cathode terminal is higher than the sum thereof. Also, the present invention includes a second voltage comparator that compares the voltage at the anode terminal with a sum of the voltage at the cathode terminal and the voltage across the first voltage source, and outputs a set signal in the case where the voltage at the anode terminal is higher than the sum thereof. Further, the present invention includes a switch circuit which is connected to the anode terminal and the cathode terminal. In addition, the present invention includes a first latch circuit that outputs a first signal that turns off the switch circuit when the reset signal is inputted from the first voltage comparator and outputs a second signal that turns on the switch circuit when the set signal is inputted from the second voltage comparator. Then, the present invention includes a diode having an anode connected to the anode terminal and a cathode connected to the cathode terminal.

Figure 1:
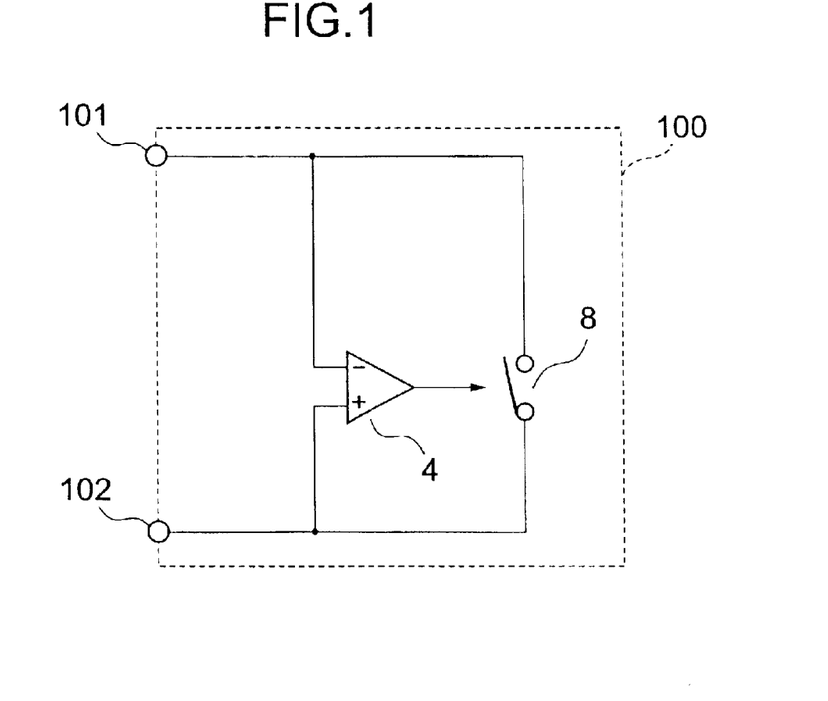
FIG. 1 is a circuit block diagram showing the outline structure of a diode circuit in accordance with the present invention.

Hereinafter, a description will be given of embodiments of the present invention with reference to the accompanying drawings. FIG. 1 is a circuit block diagram showing the outline structural example of a diode circuit in accordance with the present invention. Referring to FIG. 1, reference numeral 100 denotes a diode circuit having a switch element 8 connected between an anode terminal 102 and a cathode terminal 101. In addition, an inverting input terminal of the first voltage comparator 4 is connected to the cathode terminal 101, and a non-inverting or normal input terminal is connected to the anode terminal 102. Also, the on/off state of the switch element 8 is controlled in accordance with output signal of the first voltage comparator 4.

Figure 3:
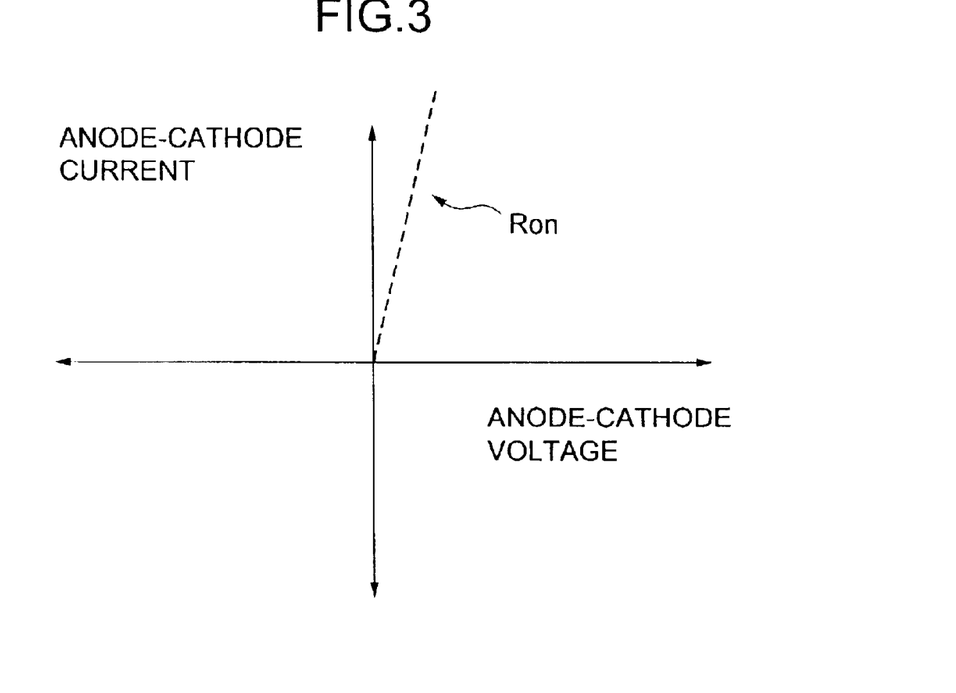
FIG. 3 is a diagram showing a relationship between a voltage and a current of the diode current shown in FIG. 1.

Hereinafter, the operation of the diode circuit shown in FIG. 1 will be described together with a relationship between the voltage between the anode and the cathode and the current between the anode and the cathode shown in FIG. 3. In the case where the voltage at the cathode terminal 101 is higher than the voltage at the anode terminal 102, the first voltage comparator 4 outputs a signal that turns off the switch element 8. Therefore, because the cathode terminal 101 and the anode terminal 102 are isolated from each other, no current flows from the cathode terminal 101 toward the anode terminal 102.

Also, in the case where the voltage at the anode terminal 102 becomes higher, and the voltage at the cathode terminal 101 becomes lower than the voltage at the anode terminal 102, the first voltage comparator 4 outputs a signal that turns on the switch element 8. Therefore, the cathode terminal 101 is rendered conductive to the anode terminal 102, and a current flows from the anode terminal 102 toward the cathode terminal 110. Ideally, the current that flows at this time, that is, a current I between the anode terminal and the cathode terminal is represented by the following Equation (1) assuming that the voltage between the anode terminal and the cathode terminal is V, and a resistance of the on resistance of the switch element 8 is Ron.

$$I = V/R_O \quad (1)$$

Hereinafter, a specific circuit structure of the diode circuit which is an example of the semiconductor integrated circuit will be described.

First Embodiment

Figure 4:
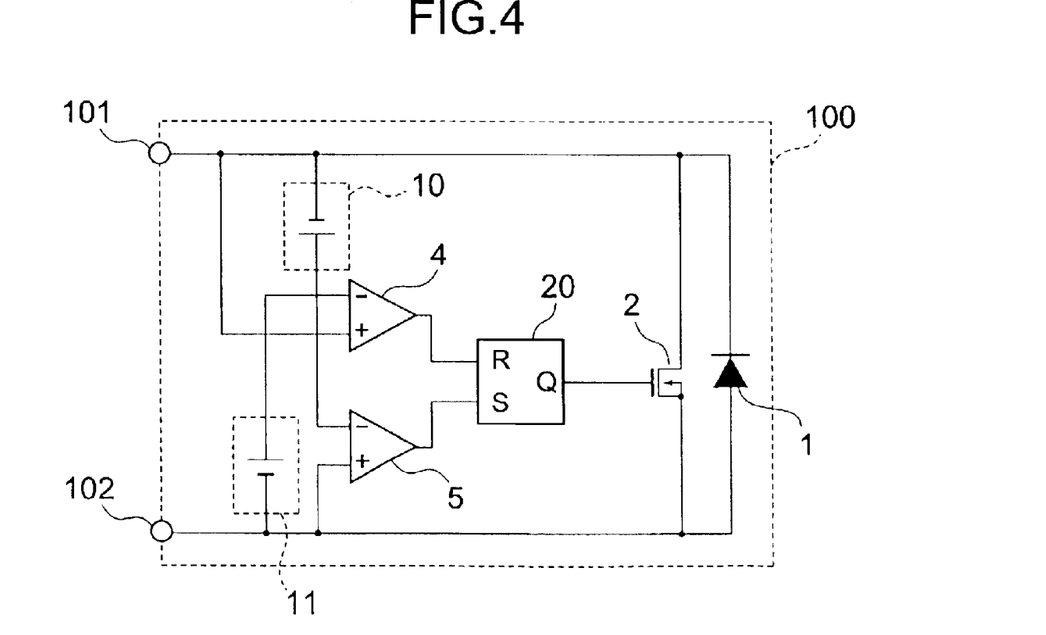
FIG. 4 is a circuit block diagram showing a structural example of the diode circuit in accordance with the present invention.

FIG. 4 shows a specific structural example of a diode circuit in accordance with a first embodiment of the present invention.

Referring to FIG. 4, an n-channel MOS transistor 2, which is a switch element, is disposed between a cathode terminal 101 and an anode terminal 102 of a diode circuit 100. A source terminal and a substrate terminal of the n-channel MOS transistor 2 are connected to the anode terminal 102, and a drain terminal thereof is connected to the cathode terminal 101. In addition, a cathode of a diode 1 is connected to the cathode terminal 101, and an anode terminal of the diode 1 is connected to the anode terminal 102. Also, a non-inverting input terminal of a second voltage comparator 5 is connected to the anode terminal 102, and an inverting input terminal of the second voltage comparator 5 is connected to a positive terminal of a first voltage source 10. In addition, a negative terminal of the first voltage source 10 is connected to the cathode terminal 101. Then, an output signal of the second voltage comparator 5 is input to the set terminal of a first latch circuit 20. The non-inverting input terminal of a first voltage comparator 4 is connected to the cathode terminal 101, and the inverting input terminal of the first voltage comparator 4 is connected to a positive terminal of a second voltage source 11. A negative terminal of the second voltage source 11 is connected to the anode terminal 102. The output of the first voltage comparator 4 is input to the reset terminal of the first latch circuit 20. The output of the first latch circuit 20 is input to the gate of the n-channel MOS transistor 2.

Figure 5:
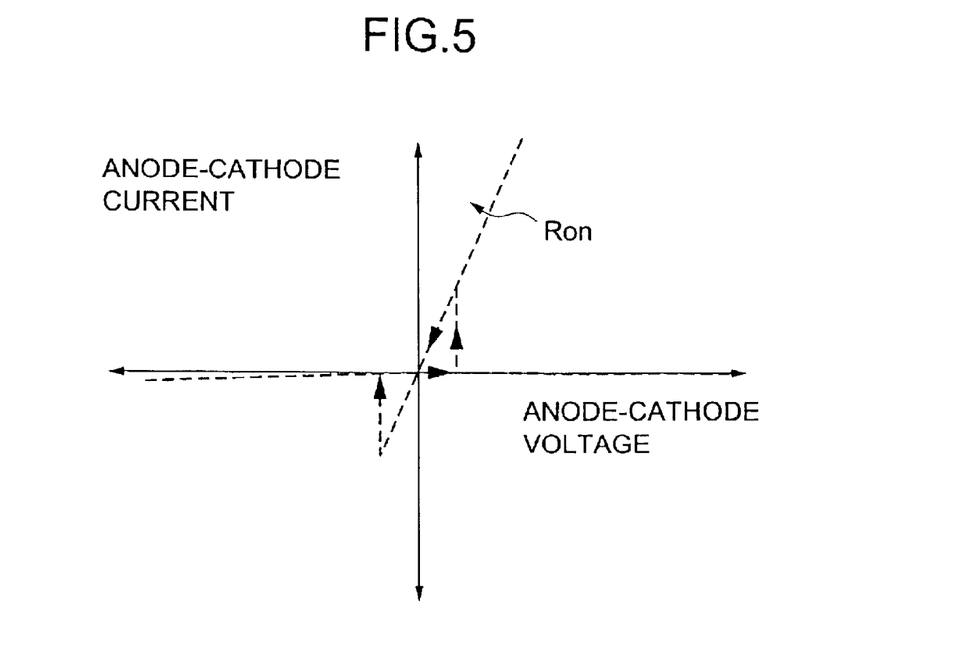
FIG. 5 is a diagram showing a relationship between a voltage and a current of the diode in accordance with the present invention.

The operation of the diode circuit shown in FIG. 4 will be described together with a relationship between the voltage between the anode and the cathode and a current between the anode and the cathode shown in FIG. 5. In the case where the voltage of the cathode terminal 101 is higher than the sum of the voltage at the anode terminal 102 and the voltage across the second voltage source 11, the first voltage comparator 4 outputs a reset signal that resets the first latch circuit 20. Therefore, the gate voltage of the n-channel MOS transistor 2 becomes L in accordance with the output from the first latch circuit 20, and the n-channel MOS transistor 2 is in an off state. For that reason, a current hardly flows from the cathode terminal 101 toward the anode terminal 102.

Then, when the voltage at the anode terminal 102 becomes high, and the voltage at the cathode voltage 101 becomes lower than the sum of the voltage at the anode terminal 102 and the voltage across the second voltage source 11, since the reset signal is not outputted, the first voltage comparator 4 cancels the reset of the first latch circuit 20.

In addition, when the voltage at the anode terminal 102 becomes higher, and the sum of the voltage at the cathode terminal 101 and the voltage across the first voltage source 10 becomes lower than the voltage at the anode terminal 102, the second voltage comparator 5 outputs a signal that sets the first latch circuit 20, and the gate voltage of the n-channel MOS transistor 2 becomes H so as to turn on the n-channel MOS transistor. As a result, a current flows from the anode terminal 102 toward the cathode terminal 101. When, from this state, the voltage at the anode terminal 102 becomes lower, and the voltage at the cathode terminal 101 becomes higher than the sum of the voltage at the anode terminal 102 and the voltage across the second voltage source 11, the first voltage comparator 4 outputs a signal that resets the first latch circuit 20. As a result, the gate voltage of the n-channel MOS transistor 2 becomes L, and the n-channel MOS transistor 2 becomes off. The loop-like current-to-voltage characteristic shown in FIG. 5 is exhibited by the above-mentioned circuit operation.

The above-mentioned circuit structure makes it possible to structure the diode circuit which withstands the fluctuation of the voltage, thereby providing the diode circuit with small power consumption.

Figure 9:
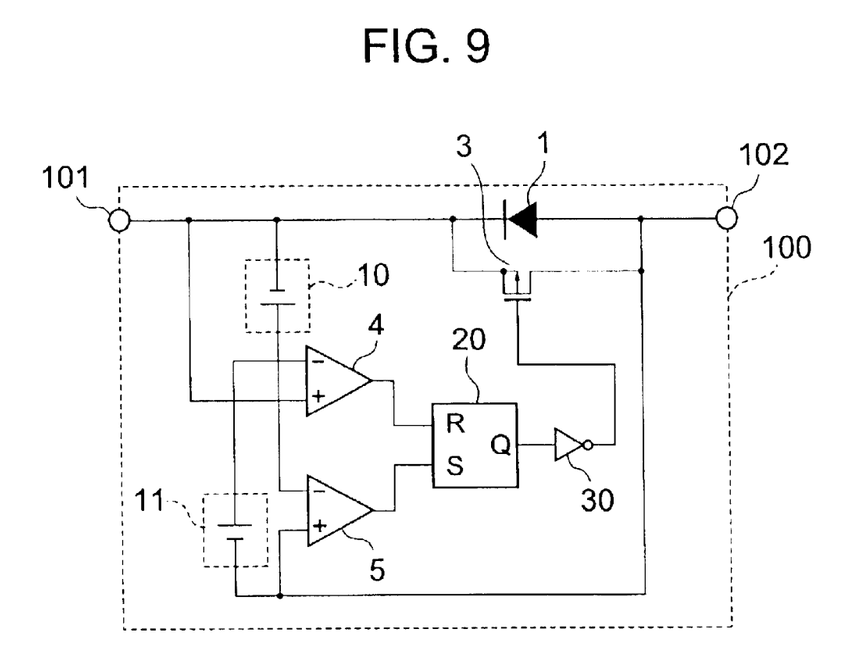
FIG. 9 is a circuit block diagram showing an example of the structural example of the diode circuit in accordance with the present invention.

Referring to FIG. 4, all of the above operation is achieved by the n-channel MOS transistor 2, but can be realized by the p-channel MOS transistor 3 by inverting the output of the first latch circuit 20 through the inverter circuit 30 as shown in FIG. 9. In this case, the source substrate terminal of the p-channel MOS transistor 3 is connected to the cathode terminal 101, and the drain terminal thereof is connected to the anode terminal 102. The following structural example is described by using the n-channel MOS transistor, but the above operation can be realized even by using the p-channel MOS transistor as in the case of FIG. 4.

Figure 10:
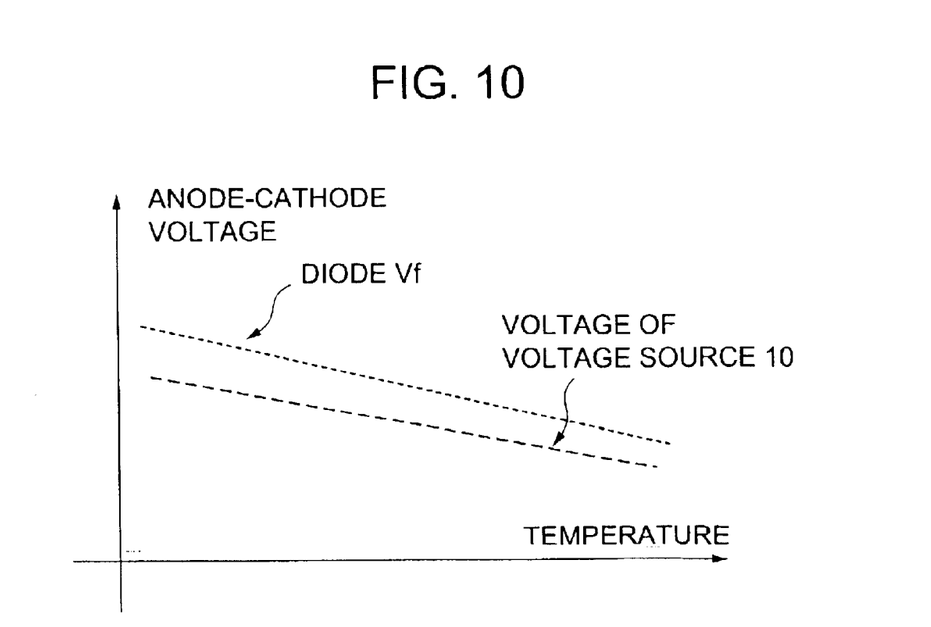
FIG. 10 is a diagram showing a temperature characteristic of the diode Vf with respect to the voltage across the voltage source of the diode circuit in accordance with the present invention.

Also, in FIG. 4, it is possible to use a reference voltage source having a temperature characteristic which is identical in symbol (polarity) with the temperature characteristic of the forward voltage Vf of the diode 1 for the voltage across the voltage source 10. A relationship of the temperature, the voltage of the voltage source 10 and the forward voltage Vf of the diode 1 at this time is shown in FIG. 10. The forward voltage Vf of the diode 1 has a temperature characteristic by which the absolute value of Vf normally becomes smaller as the temperature increases. In this case, because the voltage across the voltage source 10 also becomes smaller as the temperature increases, there is no case in which Vf becomes higher than the voltage across the voltage source 10. For that reason, in FIG. 4, the set signal of the voltage comparator 5 is output over a wide temperature range, so that a diode circuit that operates over a wide temperature range can be produced.

Figure 6:
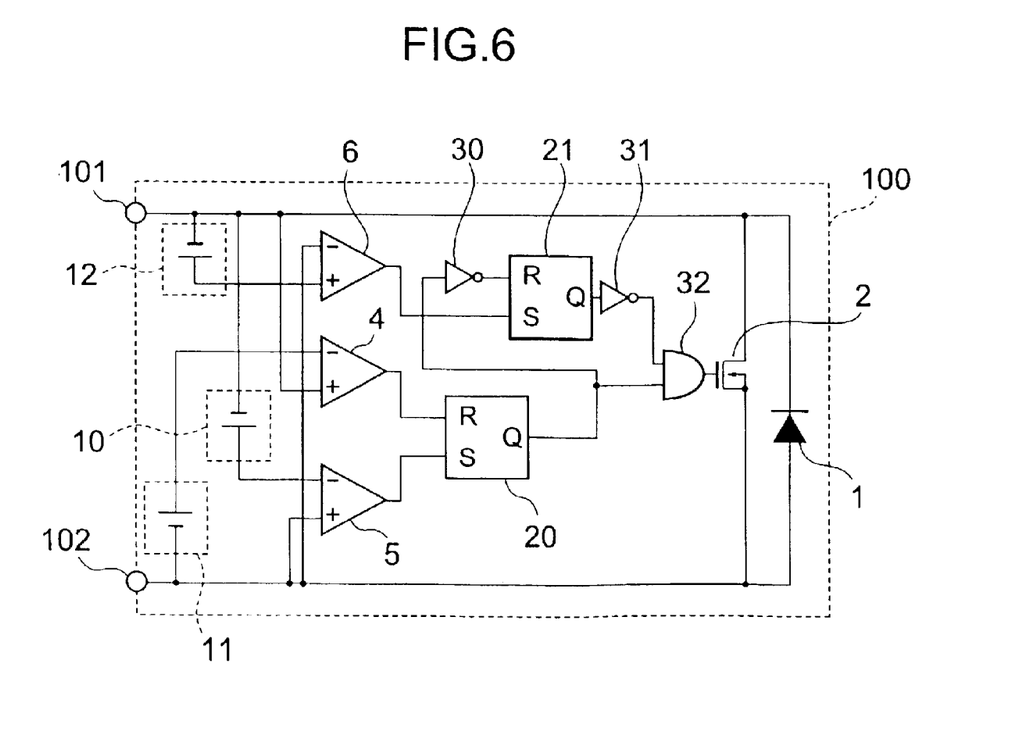
FIG. 6 is a circuit block diagram showing a structural example of the diode circuit in accordance with the present invention.

FIG. 6 shows another specific structural example of a diode circuit in accordance with a second embodiment of the present invention. The description of the same circuits as those in FIG. 4 will be omitted. An inverting input terminal of a third voltage comparator 6 is connected to the anode terminal 102, a non-inverting input terminal of the third voltage comparator 6 is connected to a positive terminal of a third voltage source 12, and a negative terminal of the second voltage source 12 is connected to the cathode terminal 101. The output of the third voltage comparator 6 is input to the set terminal of a second latch circuit 21. Also, the output of the first latch circuit 20 is inverted by the first inverter circuit 30 before being input to the reset terminal of the second latch circuit 21.

In addition, the output of the second latch circuit 21 is connected to the input of a second inverter circuit 31, and the output of the second inverter circuit 31 is connected to the input of an AND circuit 32. Also, another input of the AND circuit 32 is connected to the output of the first latch circuit 20. Then, the output of the AND circuit 32 is input to the gate of the n-channel MOS transistor 2.

Figure 7:
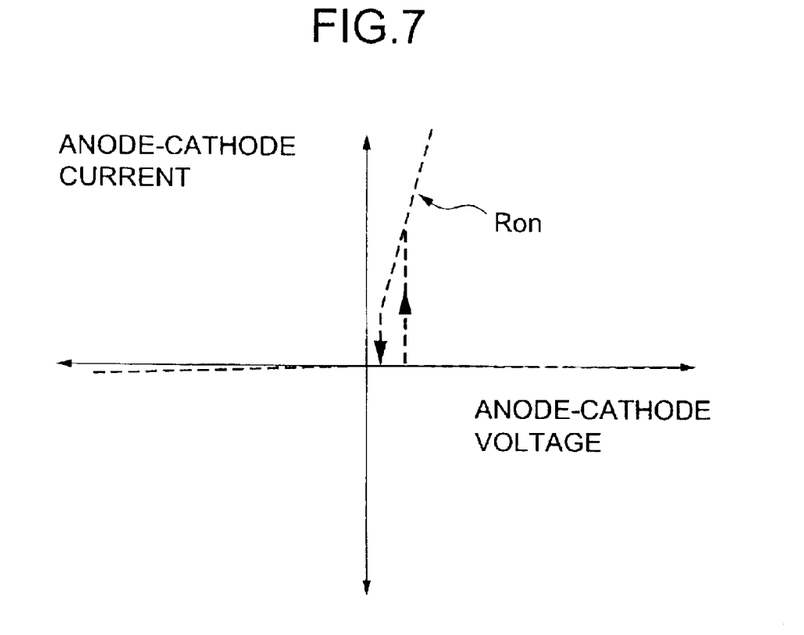
FIG. 7 is a diagram showing a relationship between a voltage and a current of the diode in accordance with the present invention.

The operation of the diode circuit shown in FIG. 6 will be described together with the relationship of the voltage between the anode and the cathode and the current between the anode and the cathode shown in FIG. 7. Note that, the same parts as those in FIG. 4 will be omitted.

In the state where the n-channel MOS transistor 2 is on, the second latch circuit 21 is reset, and the output of the second inverter circuit 31 becomes H. Then, when the voltage at the anode terminal 102 becomes lower, and the sum of the voltage at the cathode terminal 101 and the voltage across the voltage source 12 becomes higher than the voltage at the anode terminal 102, the third voltage comparator 6 outputs a set signal that sets the second latch circuit 21. As a result, the input of the second inverter circuit 31 becomes H, and the output of the second inverter circuit 31 becomes L, and the AND circuit 32 outputs an L signal. Therefore, the gate voltage of the n-channel MOS transistor 2 becomes L, and the n-channel MOS transistor turns off. For that reason, a current hardly flows from the cathode terminal 101 toward the anode terminal 102.

In this example, the voltage across the third voltage source 12 is set to be smaller than the voltage across the first voltage source 10. As a result, it is possible to structure the diode structure where no current flows in a counter direction.

Therefore, the diode circuit with small power consumption can be provided by this embodiment, likewise.

Figure 8:
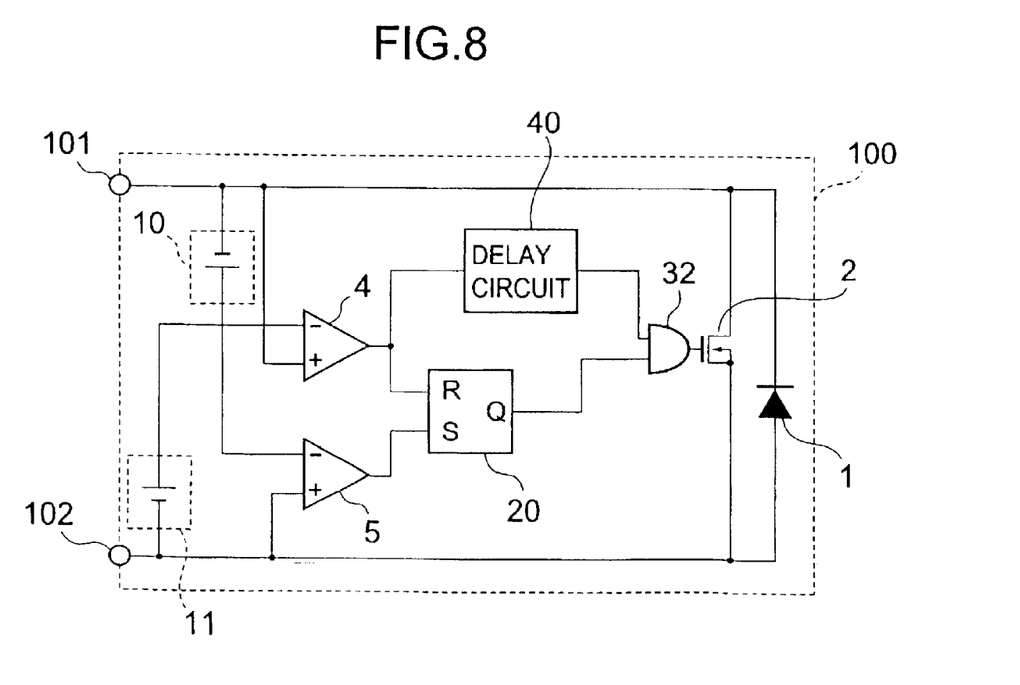
FIG. 8 is a circuit block diagram showing a structural example of the diode circuit in accordance with the present invention.

FIG. 8 shows a third embodiment. Note that the same circuit structure as that of FIG. 4 will be omitted. In a diode circuit 100 shown in FIG. 8, the output of the first voltage comparator 4 is connected to a delay circuit 40, and an output of the delay circuit 40 is connected to the input of the AND circuit 32. Also, another input of the AND circuit 32 is connected to the output of the first latch circuit 20. In addition, output of the AND circuit 32 is connected to the gate of the n-channel MOS transistor 2. The delay circuit 40 outputs an H signal for a given period of time, and is set so that the n-channel MOS transistor 2 turns on only for given period of period. As a result, in the case where the voltages at the anode terminal 102 and the cathode terminals 101 change cyclically, the n-channel MOS transistor 2 turns off by the delay circuit 40 periodically before the current flows in the counter direction.

Accordingly, it is possible to structure the diode circuit in which no current flows in the diode circuit 100 in the counter direction. In addition, there can be provided the diode circuit with small power consumption even by this embodiment as in the second embodiment.

Figure 11:
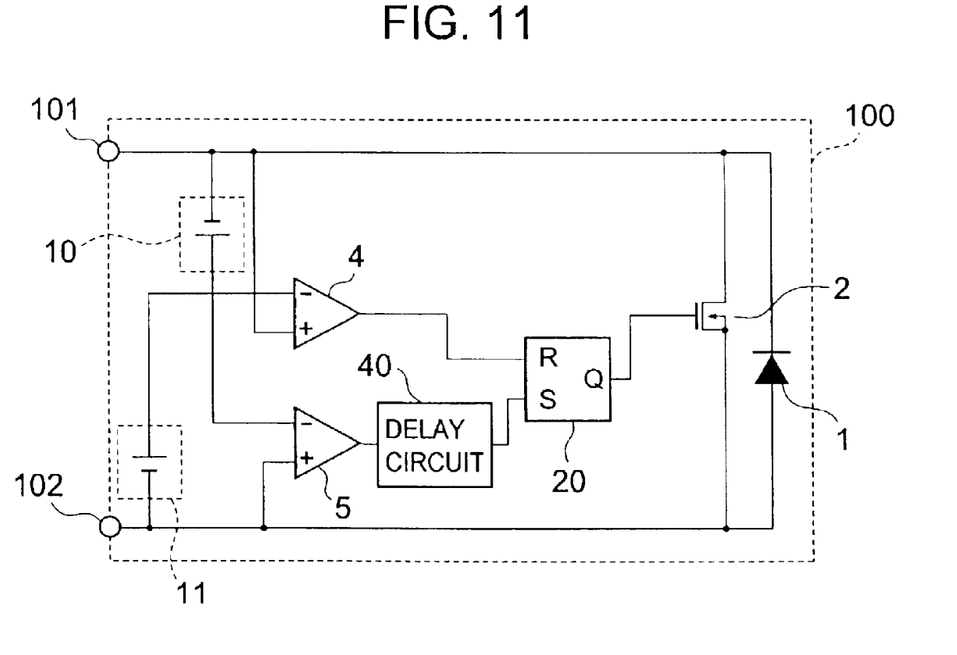
FIG. 11 is a circuit block diagram showing a structural example of a diode circuit in accordance with the present invention.

FIG. 11 shows a fourth embodiment. The same circuit structure as that of FIG. 4 will be omitted. In the diode circuit 100 shown in FIG. 11, the output of the second voltage comparator 5 is connected to the delay circuit 40, and the output of the delay circuit 40 is connected to the output of the first latch circuit 20. The delay circuit 40 continues to output the L signal for a given period of time even after inputting the input signal, and then outputs the H signal after a given delay period of time.

Figure 12:
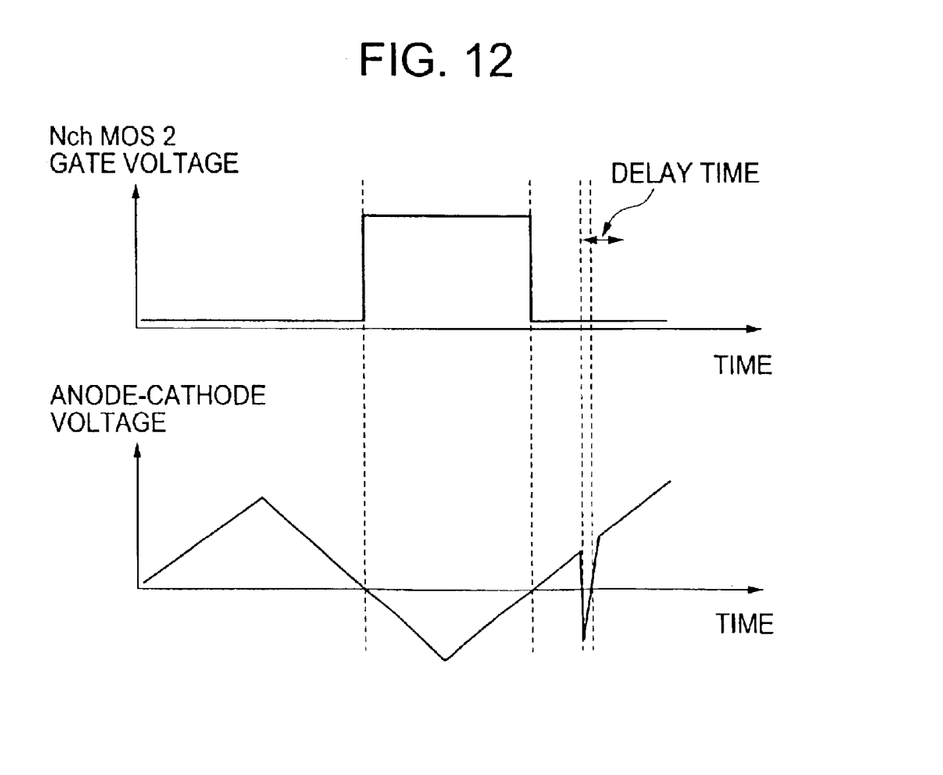
FIG. 12 is a diagram showing a relationship between a gate voltage of an n-channel MOS transistor and an anode-cathode voltage thereof in accordance with the present invention.

For that reason, it is possible to structure the diode circuit in which, as shown in FIG. 12, even if the voltage between the anode and the cathode is momentarily inverted, the gate voltage of the n-channel MOS transistor 2 is not inverted, and the stable operation is thus conducted.

According to the present invention, since the voltages at the two terminals are compared with each other, and the on/off state of the switch element connected between those two terminals is controlled by the comparison result in terms of magnitude, there can be provided the diode circuit with small power consumption.

What is claimed is:

1. A diode circuit that compares voltages at an anode terminal and a cathode terminal and controls an output current, comprising:

a first voltage source;

a second voltage source;

a first voltage comparator that compares a voltage at the cathode terminal with a sum of the voltage at the anode terminal and a voltage across the second voltage source, and outputs a reset signal when the voltage at the cathode terminal is higher than the sum of the voltage at the anode terminal and the voltage across the second voltage source;

a second voltage comparator that compares the voltage at the anode terminal with a sum of the voltage at the cathode terminal and a voltage across the first voltage source, and outputs a set signal when the voltage at the anode terminal is higher than the sum of the voltage at the cathode terminal and the voltage across the first voltage source;

a switch circuit connected to the anode terminal and the cathode terminal;

a first latch circuit that outputs a first signal that turns off the switch circuit when the reset signal is input thereto from the first voltage comparator and outputs a second signal that turns on the switch circuit when the set signal is input thereto from the second voltage comparator; and a diode having an anode connected to the anode terminal and a cathode connected to the cathode terminal.

2. A diode circuit according to claim 1; wherein the switch circuit comprises an n-channel MOS transistor having a substrate terminal connected to the anode terminal, a source terminal connected to the anode terminal, a gate terminal connected to an output of the first latch circuit, and a drain terminal connected to the cathode terminal; and wherein the first signal is a low level signal and the second signal is a high level signal.

3. A diode circuit according to claim 2; further comprising a third voltage source;

a third voltage comparator that compares a sum of the voltage at the cathode terminal and a voltage across the third voltage source with the voltage at the anode terminal, and outputs a second set signal when the sum of the voltage at the cathode terminal and the voltage across the third voltage source is higher than the voltage at the anode terminal;

a first inverter circuit for inverting the first signal output by the first latch circuit and outputting a second reset signal;

a second latch circuit that outputs a low level signal when the second reset signal is input thereto from the first inverter circuit and outputs a high level signal when the second set signal is input thereto from the third voltage comparator;

a second inverter circuit for inverting an output signal of the second latch circuit and outputting an inverted signal; and a logic circuit having as inputs the inverted signal output by the second inverter circuit and the first signal output by the first latch circuit and which outputs a high level signal to the gate terminal of the n-channel MOS transistor when the inverted signal and the first signal are both high level signals.

4. A diode circuit according to claim 1; further comprising a delay circuit for delaying the output signal of the first voltage comparator and outputting a delayed signal.

5. A diode circuit according to claim 1; wherein a temperature characteristic of the first voltage source has the same polarity as a temperature characteristic of a forward voltage of the diode.

6. A diode circuit according to claim 1; wherein a delay time occurs between a time when an output of the first voltage comparator is inverted and a time when the set signal is output.

7. A diode circuit for comparing input voltages and controlling an output current, comprising:

a diode connected between two terminals;

a first voltage comparator that compares voltages at the two terminals with each other and produces an output signal that inverts based on a potential difference between the two terminals;

a second voltage comparator that compares voltages at the two terminals with each other and produces an output signal that inverts based on a potential difference between the two terminals;

a control circuit to which an output of the first voltage comparator and an output of the second voltage comparator are input; and a switch circuit connected between the two terminals and having an on/off state that is controlled in accordance with an output of the control circuit based on the voltage difference between the two terminals.

8. A diode circuit according to claim 3; wherein the logic circuit comprises an AND gate having as inputs the inverted signal output by the second inverter circuit and the first signal output by the first latch circuit and which outputs a high level signal to the gate terminal of the n-channel MOS transistor when the inverted signal and the first signal are both high level signals.

9. A diode circuit according to claim 4; further comprising a logic circuit having as inputs the delayed signal output by the delay circuit and the first signal output by the first latch circuit and which outputs a high level signal to the switch circuit when the delayed signal and the first signal are both high level signals.

10. A diode circuit according to claim 6; further comprising a delay circuit interposed between an output of the first voltage comparator and the switch circuit.

11. A diode circuit according to claim 10; further comprising a logic circuit having as inputs an output of the delay circuit and the first signal output by the first latch circuit and which outputs a high level signal to the switch circuit when the delayed signal and the first signal are both high level signals.

12. A diode circuit according to claim 1; further comprising a delay circuit interposed between the second voltage comparator and the first latch circuit.

13. A diode circuit according to claim 1; wherein the first voltage source is connected between the cathode terminal and an inverting input of the second voltage comparator, and the anode terminal is connected to a non-inverting input of the second voltage comparator.

14. A diode circuit according to claim 13; wherein the second voltage source is connected between the anode terminal and an inverting input of the first voltage comparator, and the cathode terminal is connected to a non-inverting input of the first voltage comparator.

15. A diode circuit according to claim 1; wherein the switch circuit comprises a MOS transistor having a gate terminal connected to an output of the first latch circuit.

16. A diode circuit according to claim 15; wherein the MOS transistor has one of a source terminal and a drain terminal connected to the anode terminal and the other one of the source terminal and the drain terminal connected to the cathode terminal.

17. A diode circuit according to claim 16; wherein the MOS transistor has a substrate terminal connected to the anode terminal.

18. A diode circuit according to claim 7; wherein the control circuit comprises a first latch circuit having a reset input terminal connected to an output of the first voltage comparator and a set input terminal connected to an output of the second voltage comparator.

19. A diode circuit according to claim 7; wherein the switch circuit comprises an n-channel MOS transistor having a substrate terminal connected to a first one of the two terminals, a source terminal connected to the first one of the two terminals, a gate terminal connected to an output of the latch circuit, and a drain terminal connected to a second one of the two terminals.

* * * * *